United States Patent [19]
Pas et al.

[11] Patent Number: 5,803,980
[45] Date of Patent: Sep. 8, 1998

[54] DE-IONIZED WATER/OZONE RINSE POST-HYDROFLUORIC PROCESSING FOR THE PREVENTION OF SILICIC ACID RESIDUE

[75] Inventors: Michael F. Pas, Plano, Tex.; Jin-goo Park, Ansan, Rep. of Korea

[73] Assignee: Texas Instruments Incorporated, Dallas, Tex.

[21] Appl. No.: 725,446

[22] Filed: Oct. 4, 1996

[51] Int. Cl.[6] ........................................... B08B 3/00
[52] U.S. Cl. ................................. 134/2; 438/743
[58] Field of Search .................. 134/2, 1.3, 1.2; 438/743

[56] References Cited

U.S. PATENT DOCUMENTS

| | | |
|---|---|---|
| 4,749,640 | 6/1988 | Tremont . |
| 5,022,961 | 6/1991 | Izumi ....................... 156/646 |
| 5,665,168 | 9/1997 | Nakano ....................... 134/2 |

FOREIGN PATENT DOCUMENTS

| | | | |
|---|---|---|---|
| 0259985 | 8/1987 | European Pat. Off. ......... | H01L 21/82 |
| 0701275 A2 | 8/1995 | European Pat. Off. ...... | H01L 21/306 |
| 0702399 A1 | 9/1995 | European Pat. Off. ...... | H01L 21/306 |

OTHER PUBLICATIONS

Journal of the Electrochemical Society, vol. 142, No. 6, Jun. 1995 Effects of Drying Methods and Wettability of Silicon on the Formation of Water Marks in Semiconductor Processing.

Abstract published at the 188th Meeting of the Electrochemical Society in Chicago on Oct. 8–13, 1995.

*Primary Examiner*—Alan L. Rotman
*Assistant Examiner*—Jean F. Vollano
*Attorney, Agent, or Firm*—Mark A. Valetti; W. James Brady; Richard L. Donaldson

[57] ABSTRACT

One embodiment of the instant invention is a method of preventing the formation of silicic acid on exposed silicon of an electronic device formed on a silicon wafer and having silicon features, the method comprising: removing a portion of oxide (step 302) formed on the silicon wafer thereby exposing at least some portion of the silicon substrate or the silicon features; cleaning the silicon wafer by subjecting the silicon wafer to an ozonated solution (step 304), preferably deionized water; and drying the silicon wafer (step 306). Preferably, a thin oxide is formed on the silicon wafer during the step of subjecting the wafer to the ozonated solution. The thin oxide is, preferably, on the order of approximately 6 to 20 Å thick. After removing said portions of oxide and thereby exposing portions of said silicon wafer and/or silicon feature, the exposed silicon becomes hydrophobic. However, after the exposed silicon is subjected to the ozonated solution, the silicon wafer becomes hydrophilic—thereby preventing the formation of silicic acid on the silicon wafer or the silicon features.

12 Claims, 3 Drawing Sheets

DE-IONIZED WATER/OZONE RINSE POST-HYDROFLUORIC PROCESSING FOR THE PREVENTION OF SILICIC ACID RESIDUE

FIELD OF THE INVENTION

The instant invention pertains to semiconductor device fabrication and processing and more specifically to the post hydrofluoric etch clean-up processing.

BACKGROUND OF THE INVENTION

In a typical processing environment, a thin layer of oxide is formed on any exposed silicon regions where the wafer is exposed to air. This can occur at anytime where the wafer is not contained in an evacuated chamber. For example, this could occur when the wafer is taken from one processing chamber to another. In order to remove this thin layer of oxide and other selective elements, the wafer is typically subject to a hydrofluoric etch.

Oxide coated silicon surfaces are hydrophilic and hydrofluoric etched (HF etch) silicon surfaces are hydrophobic due to the removal of oxide and the hydrogen termination. The HF-last process is attractive in terms of gate oxide integrity (GOI), minority carrier lifetime (MCLT), and low metallic contamination in pre-furnace wet processes. However, HF-last process on bare silicon surfaces introduces a highly hydrophobic and reactive surface created by the HF removal of oxide from the wafer. This HF etched surface is very susceptible to silicic acid residue in a subsequent rinse bath, which is present in the post etch cleaning solution. The defect cause d by the silicic acid adhering to the wafer is called 'water marks', and occurs after the wafer drying process.

Water marks created at any cleaning step before gate oxidation can cause electrical failures due to locally thicker oxide formation. One of the main reasons for the creation of water marks can be attributed to the hydrophobicity of HF etched silicon wafers with the change in wettability due to the complexity of patterns during drying processes.

A typical post-HF etch clean process is depicted in FIG. 1. First, as is shown in HF etch step 100, the thin layer of oxide is removed using an HF etch. After this step is completed, any exposed silicon on the wafer is hydrophobic. Next, the wafer is immersed in deionized water (DIW) so as to remove any remaining HF and any other undesired elements that remain after HF etching step 100. This step is depicted in FIG. 1 as step 102. Due to the fact that the wafer is hydrophobic and that colloidal silica is present in the DIW, the collodial silica will attach to the wafer while in the DIW bath. Collodial silica adhered to a wafer is referred to as silicic acid or 'water marks'.

The wafer is subsequently dried in step 104. If the collodial silica remains adhered to the wafer prior to drying then it becomes extremely difficult to remove once the drying process is complete. Drying step 104 is typically accomplished by subjecting the wafer to heated isopropyl alcohol vapor.

The results of a typical post-HF etch clean process are depicted in FIGS. 2a and 2b. FIG. 2a illustrates a memory array 200. Memory array 200 is comprised of memory cells. Some of the memory cells are functional (unshaded areas). These are denoted as cells 202. However, several cells, cells 204, are not functional (shaded areas) due to the formation of silicic acid formed in these regions.

FIG. 2b illustrates a sense amplifier area on a 16-megabit DRAM array. Region 210 represents bare silicon. Regions 214 represent insulating regions, preferably $SiO_2$. Circular region 212 is a water mark. In other words, region 212 is a region of bare silicon in which silicic acid is attached. As with cells 204 in FIG. 2a, region 212 represents an area in which the device is defective due to the attachment of collodial silica to the wafer.

It is, therefore, an object of the instant invention to reduce (preferably eliminate) the formation of water marks on the semiconductor devices. More specifically, it is an object of the invention to make an hydrophobic surface to be hydrophilic.

SUMMARY OF THE INVENTION

The hydrophilization of HF etched wafers prevents the formation of water marks from any wet/dry processes. The presence of metallic impurities in wet chemicals such as hydrogen peroxide degrades GOI and MCLT when the last cleanup process involves SC2 (preferably using $H_2O_2$, Hcl, and $H_2O$) cleaning chemicals even though they can produce the hydrophilic surfaces. Ozonated deionized water (DI water or DIW) has been introduced into semiconductor wet processes in the place of $H_2O_2$ as a strong oxidant. The application of ozonated DI water added chemicals to wafer cleaning showed equal or better particle and metal removal performances than conventional $H_2O_2$ based SC2 chemicals.

One embodiment of the instant invention is a method of preventing the formation of silicic acid on exposed silicon of an electronic device formed on a silicon wafer and having silicon features, the method comprising: removing a portion of oxide formed on the silicon wafer thereby exposing at least some portion of the silicon substrate or the silicon features; cleaning the silicon wafer by subjecting the silicon wafer to an ozonated solution, preferably deionized water; and drying the silicon wafer. Preferably, a thin oxide is formed on the silicon wafer during the step of subjecting the wafer to the ozonated solution. The thin oxide is, preferably, on the order of approximately 6 to 20 Å thick. After removing said portions of oxide and thereby exposing portions of said silicon wafer and/or silicon feature, the exposed silicon becomes hydrophobic. However, after the exposed silicon is subjected to the ozonated solution, the silicon wafer becomes hydrophilic—thereby preventing the formation of silicic acid on the silicon wafer or the silicon features.

DETAILED DESCRIPTION OF THE DRAWINGS

The instant invention relates to rinsing a silicon wafer in which at least a portion of the wafer contains exposed silicon or polysilicon regions. The rinse of the instant invention is preferably an ozonated deionized water solution. The instant invention is preferably utilized after an HF etch and prior to drying the wafer. A purpose of the instant invention is to eliminate water marks.

Figure 1:
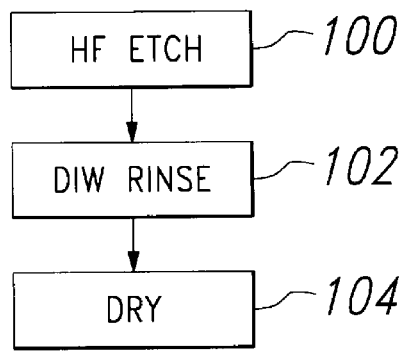
FIG. 1 is a flow diagram of the typical method of performing an HF etch and post-etching clean-up.
Figure 3:
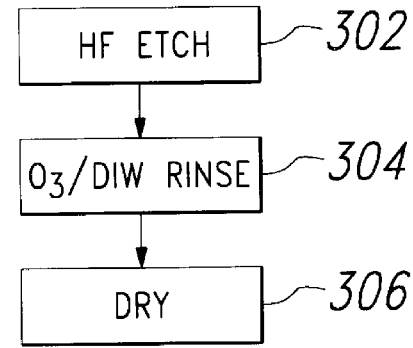
FIG. 3 is a flow diagram illustrating an embodiment of the instant invention.

An embodiment of the present invention is illustrated in FIG. 3. Referring to FIG. 3, HF etch step 302 can be accomplished by any typical HF etching process. The importance of HF etch step 302 is that some region of the silicon or polysilicon becomes exposed by the removal of oxide in step 302. Once the oxide is removed and the silicon or poly becomes exposed, then that portion of the wafer becomes hydrophobic and, therefore, is susceptible to water marks. As was discussed above, a water mark (also referred to as silicic acid) is merely the adherence of collodial silica to portions of a wafer.

Figure 4A:
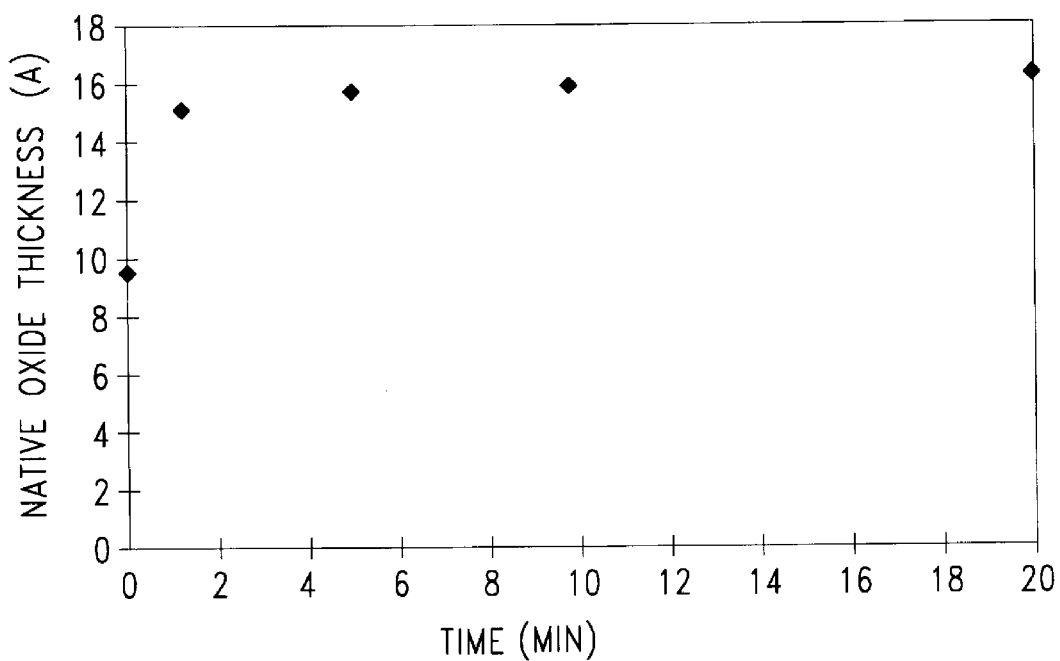
FIG. 4a is a graph illustrating the growth of an oxide layer versus time using an embodiment of the instant invention.
Figure 2A:
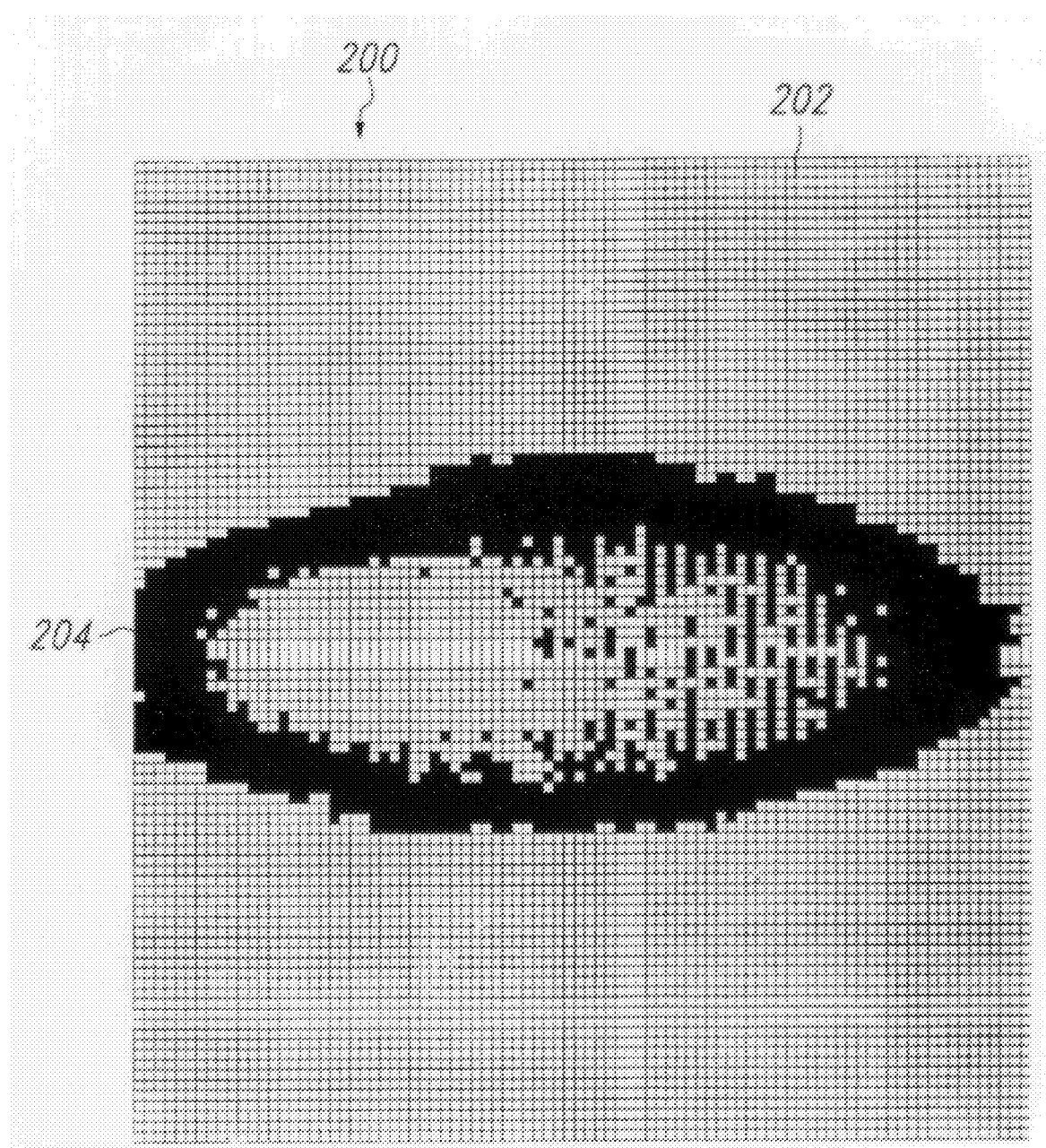
FIG. 2a is an illustration of a memory array with a plurality of defective cells.
Figure 2B:
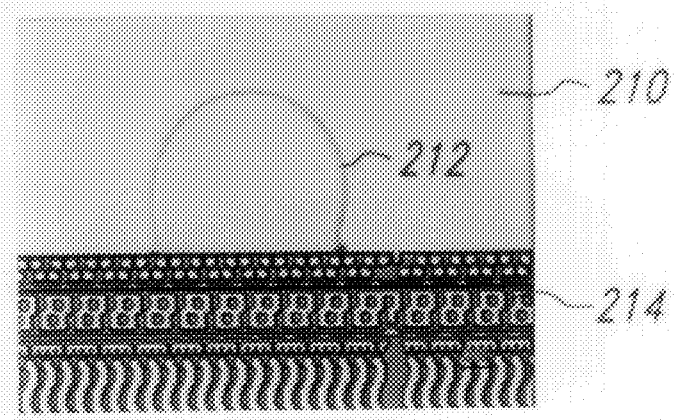
FIG. 2b is an illustration of a sense amplifier area on a 16-megabit DRAM array with a water mark.

Such adherence can be eliminated by the novel introduction of ozone in DIW rinse step 304. As is illustrated in FIG. 4a, a thin layer of oxide (preferably 6 to 16 Å; more preferably 8 to 12 Å) is grown on the exposed surfaces of silicon or poly during this step. This thin oxide renders the wafer hydrophilic, thereby causing any collodial silica in the DIW solution to be easily removed (and maybe even making it such that the collodial silica can not adhere to the wafer).

The DIW can be ozonated by connecting an ozone generator to a side of the over-flowing DIW rinse tank. This connection can be made using stainless steel tubing, and the ozone can be made by simply applying an electrical charge to a source of oxygen.

Figure 4B:
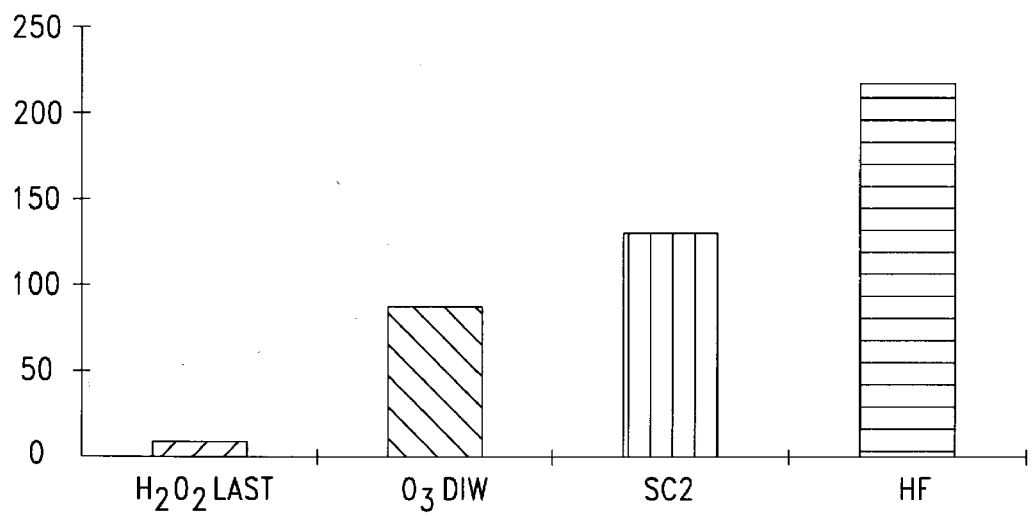
FIG. 4b is a bar graph illustrating the minority carrier lifetime for different clean-up methods.

FIG. 4b is a bar graph illustrating the minority carrier lifetime (MCLT) for different clean-up processes. The different bars represent the different clean-up processes. Going from left to right, the clean-up processes are as follows: an $H_2O_2$ rinse, the rinse of the instant invention, an SC2 rinse (also referred to as standard-clean2 or SC2), and an HF clean. The SC2 rinse is typically a rinse in a solution containing HCl, $H_2O_2$, and $H_2O$.

MCLT is the measurement of the lifetime of minority carriers. It is measured by microwave photo conductive decay and it relates to the metallic contamination on the surface of a wafer and actually in the bulk of the wafer. Therefore, the greater the MCLT value for a particular clean-up step the lower the metallic contamination.

Figure 4C:
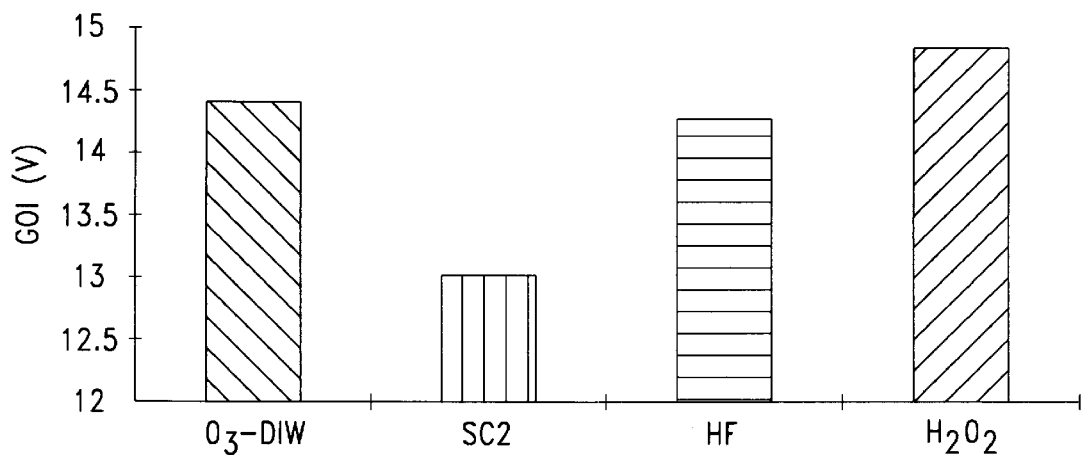
FIG. 4c is a bar graph illustrating the gate oxide integrity for different clean-up methods.

FIG. 4c is a bar graph illustrating the gate oxide integrity (GOI) for different clean-up processes. Each bar of the graph represents a different clean-up process. From left to right, the different clean-up processes illustrated are: the clear -up process of the instant invention, standard-clean-2 (SC2) clean-up, HF clean-up, and an $H_2O_2$ clean up. More specifically, the process the wafers were exposed to was: first, they where cleaned with either the clean-up of the instant invention, SC2, HF clean-up or an $H_2O_2$ clean-up; next the wafers were dried using isopropyl alcohol vapors; finally, a 100 Å $SiO_2$ film was grown on each wafer.

GOI, gate oxide integrity, is the electrical measurement of the electric field which an $SiO_2$ film situated under a gate can withstand if the breakdown field is low (less than approximately 10 mV/cm². Such a measurement corresponds to the metallic contamination that occurs.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of preventing the formation of at least one water mark on exposed silicon of an electronic device formed on a silicon wafer, said method comprising:

exposing at least some portion of said silicon substrate or said exposed silicon;

subjecting said silicon wafer to an ozonated solution; and drying said silicon wafer.

2. The method of claim 1, wherein said step of exposing at least some portion of said silicon substrate or said exposed silicon is comprised of subjecting said silicon wafer to a hydrofluoric solution.

3. The method of claim 1, wherein subjecting said silicon wafer to an ozonated solution is subjecting said silicon wafer to ozonated deionized water.

4. The method of claim 3, wherein said subjecting said silicon wafer to ozonated deionized water occurs so as to rinse said silicon wafer.

5. The method of claim 1, wherein said drying occurs by subjecting said silicon wafer to isopropyl alcohol vapors.

6. A method of preventing the formation of silicic acid on an exposed portion of a silicon wafer or a silicon feature, said method comprising:

exposing some portion of said silicon wafer or said silicon feature so as to render that portion of said silicon substrate or silicon feature hydrophobic;

subjecting said silicon wafer and said silicon feature to an ozonated solution so as to render the exposed portion of silicon wafer and said exposed portion of said silicon feature hydrophilic; and drying said silicon wafer.

7. A method of preventing the formation of silicic acid on exposed silicon of an electronic device formed on a silicon wafer and having silicon features, said method comprising:

removing a portion of oxide formed on said silicon wafer thereby exposing at least some portion of said silicon substrate or said silicon features;

cleaning said silicon wafer by subjecting said silicon wafer to an ozonated solution; and drying said silicon wafer.

8. The method of claim 7, wherein said ozonated solution is ozonated deionized water.

9. The method of claim 7, wherein a thin oxide is formed on said silicon wafer during said step of subjecting said wafer to said ozonated solution.

10. The method of claim 9, wherein said thin oxide is approximately 6 to 20 Å thick.

11. The method of claim 7, wherein said subjecting said silicon wafer to an ozonated solution renders said silicon wafer hydrophilic.

12. The method of claim 7, wherein said exposed silicon substrate or silicon features become hydrophobic after said portion of oxide is removed.

* * * * *

UNITED STATES PATENT AND TRADEMARK OFFICE
CERTIFICATE OF CORRECTION

PATENT NO. : 5,803,980
DATED : September 8, 1998
INVENTOR(S) : Michael F. Pas and Jin-Goo Park It is certified that error appears in the above-identified patent and that said Letters Patent is hereby corrected as shown below:

Title page,
Item [56], Continuing Data, add -- Provisional application No. 60/004,819, October 5, 1995. --

Column 1,
Between lines 1 and 2, add -- This application claims priority under 35 U.S.C. § 119(e)(1) of provisional application number 60/004,819 filed October 5, 1995: --

Column 3,
Line 48, delete "the clear-up" and insert -- the clean-up. --

Signed and Sealed this

Twenty-fifth Day of June, 2002

Attest:

JAMES E. ROGAN
Attesting Officer
Director of the United States Patent and Trademark Office